US008242378B2

(12) United States Patent
Amin et al.

(10) Patent No.: US 8,242,378 B2
(45) Date of Patent: Aug. 14, 2012

(54) SOLDERING METHOD AND RELATED DEVICE FOR IMPROVED RESISTANCE TO BRITTLE FRACTURE WITH AN INTERMETALLIC COMPOUND REGION COUPLING A SOLDER MASS TO AN NI LAYER WHICH HAS A LOW CONCENTRATION OF P, WHEREIN THE AMOUNT OF P IN THE UNDERLYING NI LAYER IS CONTROLLED AS A FUNCTION OF THE EXPECTED VOLUME OF THE SOLDER MASS

(75) Inventors: Ahmed Amin, Allentown, PA (US);
Frank Baiocchi, Allentown, PA (US);
John Delucca, Montgomery, PA (US);
John Osenbach, Kutztown, PA (US);
Brian T. Vaccaro, Mertztown, PA (US)

(73) Assignee: Agere Systems Inc., Allentown, PA (US)

( * ) Notice: Subject to any disclaimer, the term of this patent is extended or adjusted under 35 U.S.C. 154(b) by 1009 days.

(21) Appl. No.: 12/160,553

(22) PCT Filed: Sep. 21, 2007

(86) PCT No.: PCT/US2007/020479
§ 371 (c)(1),
(2), (4) Date: Jul. 10, 2008

(87) PCT Pub. No.: WO2009/038565
PCT Pub. Date: Mar. 26, 2009

(65) Prior Publication Data
US 2010/0243300 A1   Sep. 30, 2010

(51) Int. Cl.
*H05K 1/09*   (2006.01)
*B23K 31/02*   (2006.01)
*B23K 1/20*   (2006.01)

(52) U.S. Cl. ........ 174/257; 174/259; 174/261; 361/751; 361/771; 361/803

(58) Field of Classification Search ................. 174/257, 174/259, 261; 361/751, 771, 803
See application file for complete search history.

(56) References Cited

U.S. PATENT DOCUMENTS

| 6,041,495 | A | * | 3/2000 | Yoon et al. | 29/841 |
| 6,445,069 | B1 | * | 9/2002 | Ling et al. | 257/738 |
| 6,992,397 | B1 | * | 1/2006 | Nguyen | 257/778 |
| 7,009,299 | B2 |  | 3/2006 | Angst et al. | |
| 8,064,219 | B2 | * | 11/2011 | Taniguchi | 361/772 |
| 2002/0112884 | A1 |  | 8/2002 | Tanaka | |

(Continued)

FOREIGN PATENT DOCUMENTS
WO   PCT/US07/20479   2/2008

*Primary Examiner* — Randy W Gibson
(74) *Attorney, Agent, or Firm* — Ryan, Mason & Lewis, LLP

(57) ABSTRACT

A lead-free solder joint is formed between a tin-silver-copper solder alloy (SAC), SACX, or other commonly used Pb-free solder alloys, and a metallization layer of a substrate. Interaction of the SAC with the metallization layer forms an intermetallic compound (IMC) that binds the solder mass to the metallization layer. The IMC region is substantially free of any phosphorous-containing layers or regions.

12 Claims, 15 Drawing Sheets

U.S. PATENT DOCUMENTS

| | | |
|---|---|---|
| 2002/0114726 A1 | 8/2002 | Soga et al. |
| 2004/0020045 A1* | 2/2004 | Hirano ............................ 29/846 |
| 2004/0126269 A1 | 7/2004 | Nozawa et al. |
| 2005/0029666 A1 | 2/2005 | Kurihara et al. |
| 2005/0067699 A1 | 3/2005 | Leong et al. |
| 2006/0068218 A1 | 3/2006 | Hooghan et al. |
| 2006/0251910 A1* | 11/2006 | Lancsek et al. ............... 428/457 |
| 2008/0264681 A1* | 10/2008 | Iwai et al. ..................... 174/257 |
| 2009/0218387 A1* | 9/2009 | Kurata et al. ................. 228/256 |
| 2010/0243300 A1* | 9/2010 | Amin et al. ................... 174/257 |

* cited by examiner

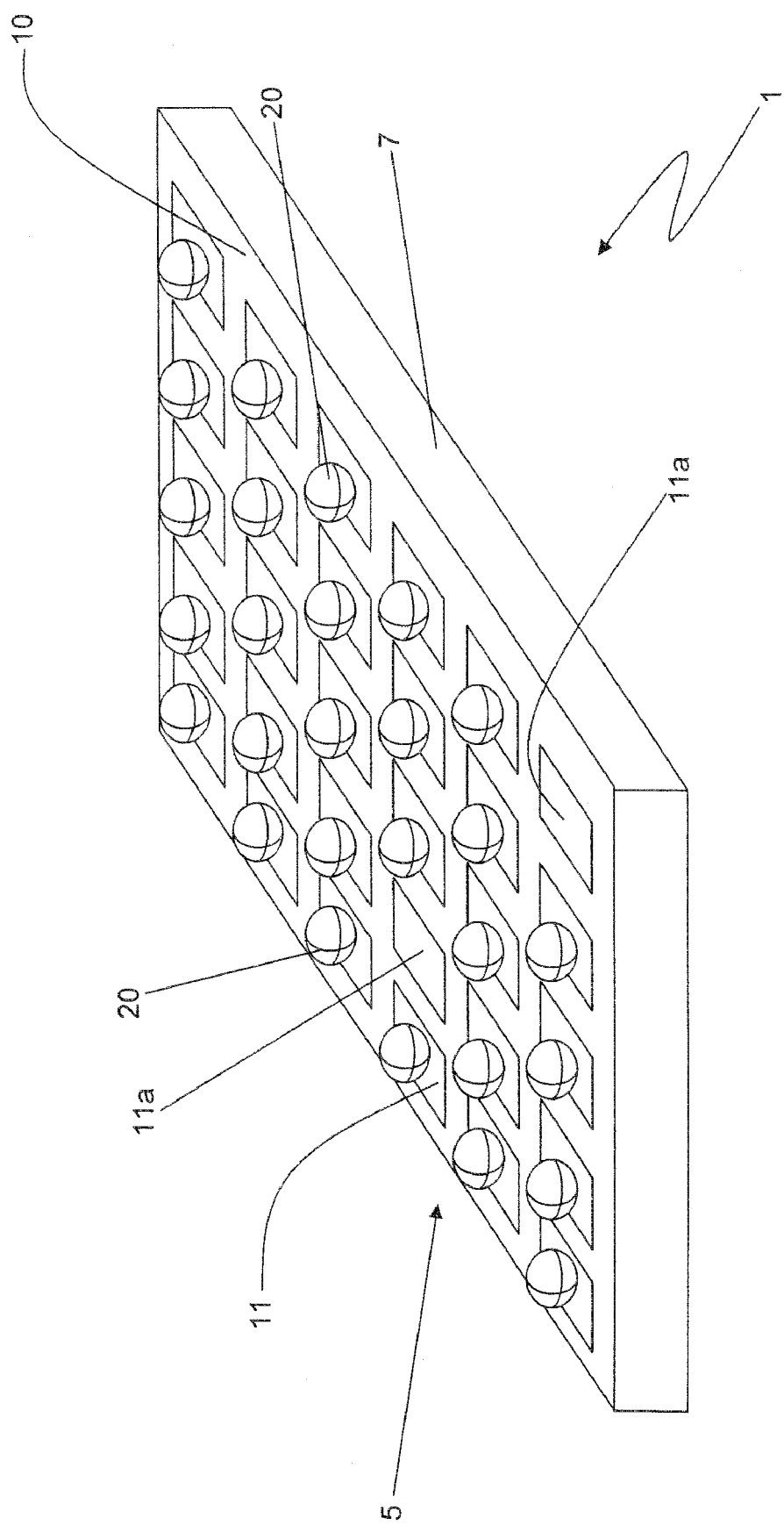
Fig. 1, Prior Art

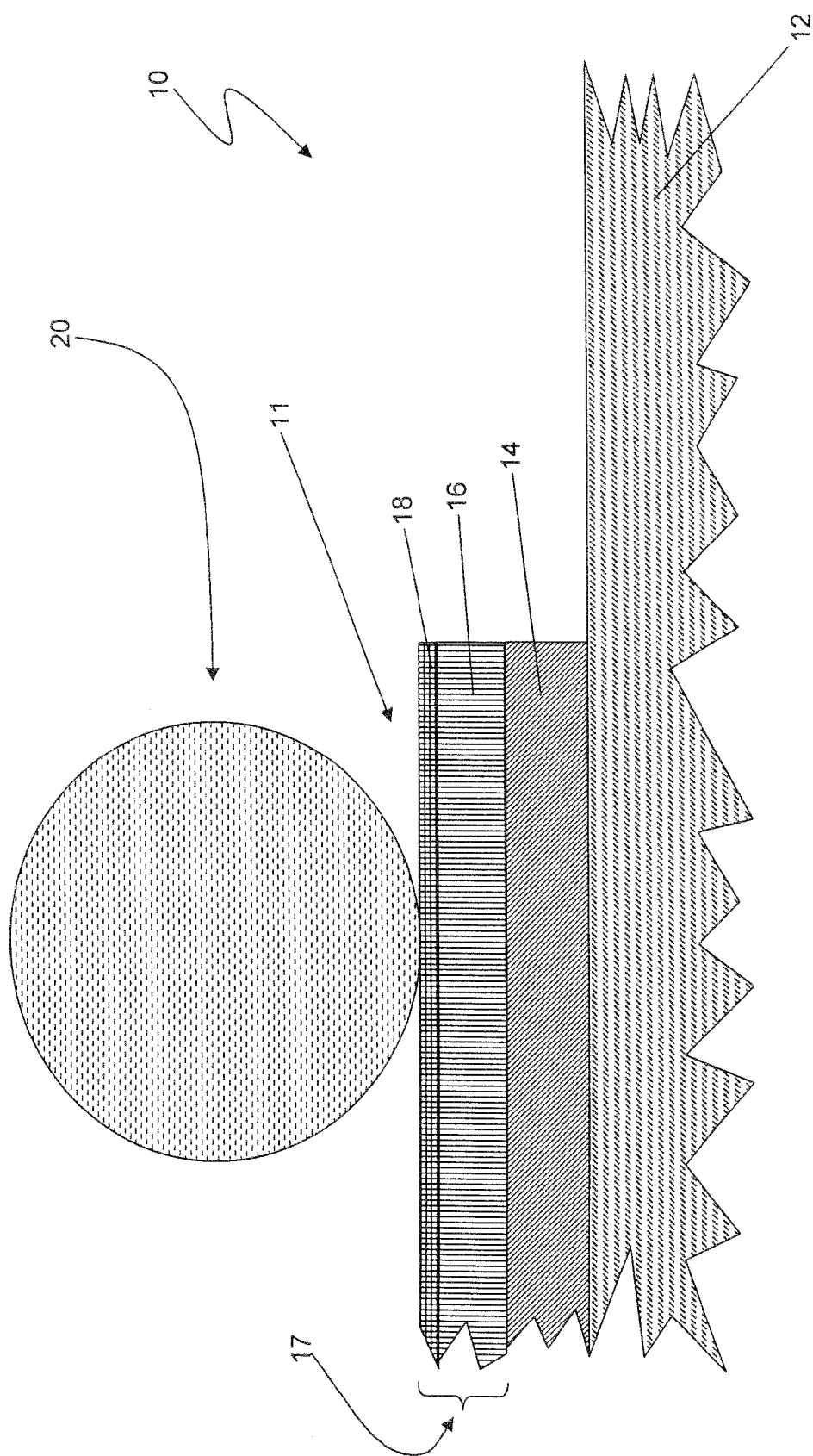
Fig. 2, Prior Art

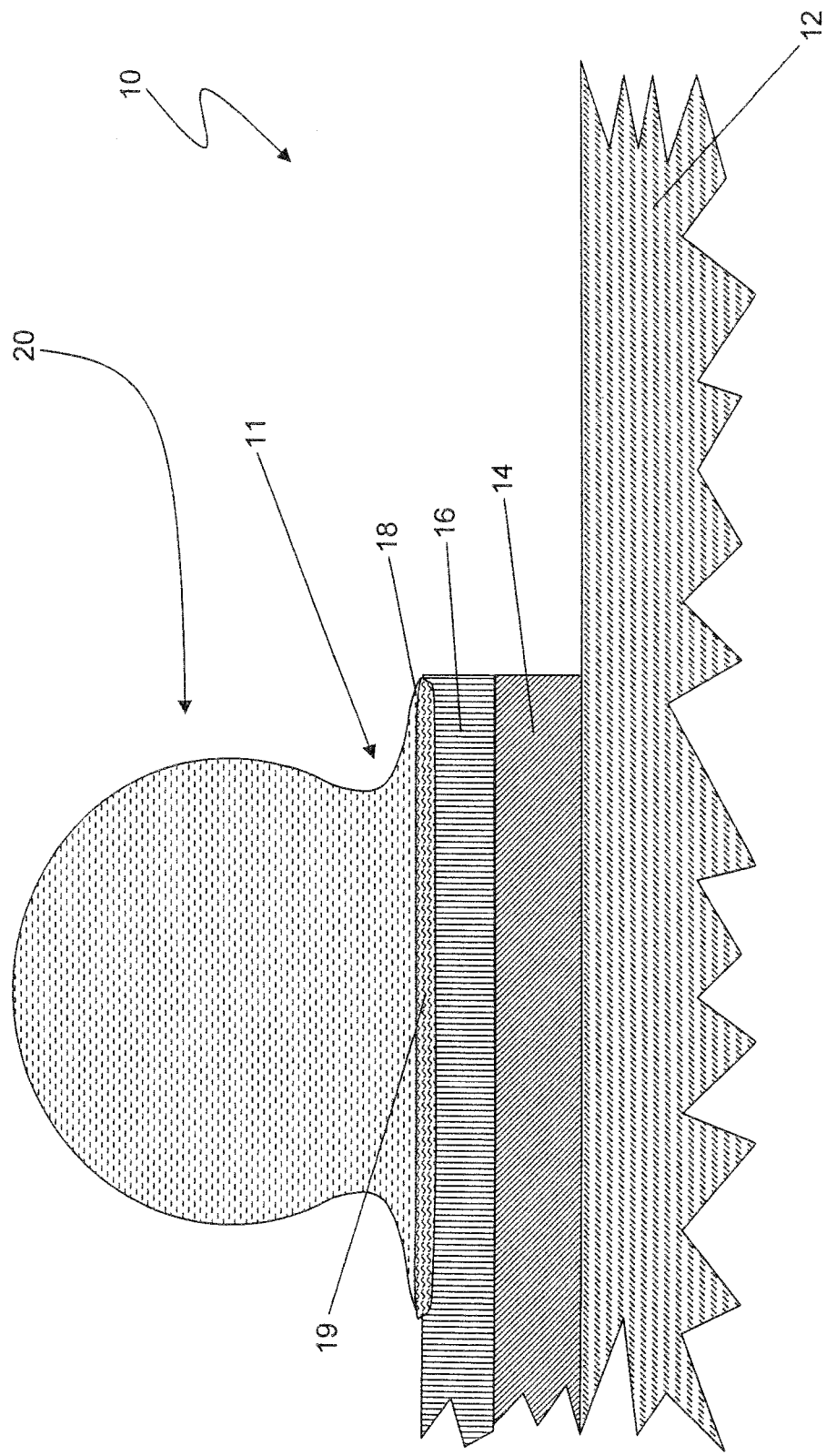
Fig. 3, Prior Art

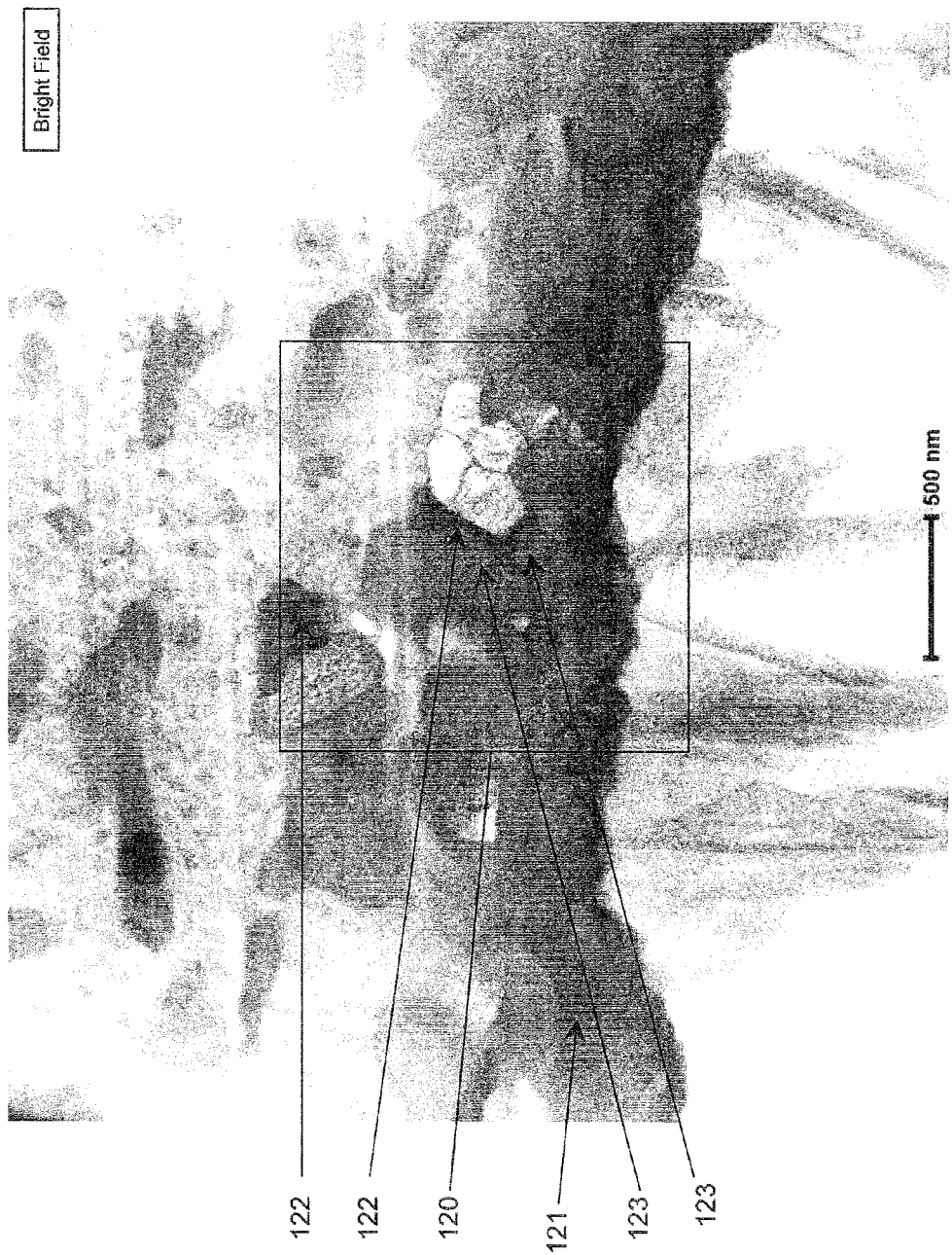

SOLDERING METHOD AND RELATED DEVICE FOR IMPROVED RESISTANCE TO BRITTLE FRACTURE WITH AN INTERMETALLIC COMPOUND REGION COUPLING A SOLDER MASS TO AN NI LAYER WHICH HAS A LOW CONCENTRATION OF P, WHEREIN THE AMOUNT OF P IN THE UNDERLYING NI LAYER IS CONTROLLED AS A FUNCTION OF THE EXPECTED VOLUME OF THE SOLDER MASS

FIELD OF THE INVENTION

The present invention relates generally to soldering. More particularly, the present invention discloses a method for reducing brittle fracture failure rates in joints made with lead-free solders.

BACKGROUND OF THE INVENTION

In response to environmental concerns and legislative action, manufacturers of electronic devices are switching from lead-containing (Pb-containing) to lead-free (Pb-free) solders. The transition from Pb-containing to Pb-free solders has not been without problems. The most widely used Pb-free solders in the electronics industry contain a high tin (Sn) content, typically in excess of 94 wt. %, and further contain silver (Ag), copper (Cu), or both, and possibly other elements such as nickel (Ni), cobalt (Co), zinc (Zn), bismuth (Bi), etc. Solder alloys that contain Sn, Ag, and Cu are referred to as SAC solders. If they contain an additional element they are usually referred to as SACX, where X represents the additional element. SAC and SACX Pb-free solders typically have a higher melting point than eutectic PnSn solders. Therefore, the required peak reflow temperatures are higher for Pb-free solders than for eutectic Pb/Sn solders. These higher reflow temperatures can lead to undesirable thermal loading effects including those associated with differential thermal expansion-induced stresses. SAC and SACX Pb-free solders have a higher elastic modulus and yield point than PbSn solders (see, for example, the NIST web site). Furthermore, the yield point of Pb-free alloys, which essentially puts a limitation on the magnitude of the stress the joint can be exposed to, is more sensitive to the strain rate of the applied stress than for PbSn alloys. These combined mechanical properties of Pb-free solders tend to make joints that are more susceptible to brittle failure than joints made from PbSn solders. This is especially true when the joints are exposed to stresses applied at high strain rates, such as those that may occur during testing, handling, and assembly. Packages that contain solder spheres, typically referred to as solder balls or solder bumps, as part of the overall device electrical interconnect are prone to high strain rate brittle fracture. One such problem is referred to as solder ball drops, or missing solder spheres.

FIG. 1 shows the bottom side of a ball grid array (BGA) package 1 that will eventually be attached to another electrical circuit, such as a circuit board. The electrical and mechanical interconnect of the package 1 to a circuit board may be made via solder spheres 20, typically referred to as solder balls 20. It will be appreciated that here and in the rest of this disclosure none of the figures are to scale; the sizes of some items have been exaggerated, while others have been reduced, for a presentation that is easier to see. A BGA 5 of the package 1 comprises a substrate 10, which is typically a laminate made from conductive and non-conductive layers. The conductive layers connect an integrated circuit embedded in polymer 7 on a front side of the substrate 10 to the bottom side of the substrate 10. The bottom side of the substrate 10 has exposed metal pads 11 onto which solder balls 20 can be attached. The exposed metal pads 11 are typically comprised of Cu, which provides the conductive layers in the substrate 10, coated with an electrolytic deposit of a bi-layer nickel/gold (Ni/Au) film. The solder balls 20 may be used to subsequently solder the electrical device 1 onto a circuit board or other electrical component.

FIG. 2 is a side-view of a portion of the electrical device 1 just prior to solder reflow of the balls 20 to the BGA pads 11. The substrate 10 includes a non-conductive core layer 12, which is typically bismaleimide triazine (BT). Cu traces 14 are disposed on both sides of the core layer 12 in complex three dimensional patterns with an array of via through holes such that the Cu traces 14 provide an electrical connection from the die interconnect to the bottom side of the BGA substrate 10. Atop the Cu traces 14 is a polymer film (not shown in the figure), typically referred to as a solder mask. The polymer film has holes that selectively expose the Cu trace 14. The exposed regions in the Cu layer 14 are subsequently coated with a bi-layer Ni/Au film 17 via electrolytic plating. The gold (Au) layer 18 provides a wettable surface for solder ball 20 attachment. Because Cu is a fast diffuser in Au, a barrier that prevents fast migration of Cu through the Au layer 18 is often used to insure that the Au surface maintains it's wettability to solder 20. This barrier is provided by the Ni layer 16. In addition, the Ni layer 16 is both metallurgically compatible with the solder 20 and prevents migration of the Cu from the Cu layer 12 into the solder 20. The Au layer 18 further protects the Ni layer 16 from oxidation. Typical metallic layer thicknesses are 10 to 70 µm for the Cu layer 14, 2 to 10 µm for the Ni layer 16, and 0.05 to 2 µm for the Au layer 18.

FIG. 3 is a side-view showing a solder ball 20 bonded to its respective pad 11. Although not shown, flux is generally disposed over the Au layer 18 or onto the solder balls 20 prior to solder ball attachment. The flux is used both to remove the naturally occurring metallic oxides that are present on the solder balls 20, as well as to hold the solder balls 20 in place until the solder reaches it's melting point, at which time the solder 20 reacts with the pad 11 metallization. After fluxing, the solder balls 20 are placed on top of the BGA pads 11. After solder ball 20 placement, the substrate 10 is then inserted into a reflow oven, during which time the solder 20 is melted and wets the BGA pads 11. The Pb-free solder balls 20 are typically an alloy of tin (Sn), silver (Ag) and copper (Cu), although other Pb-free alloys can also be used The reflow process heats and then cools the solder ball 20 to bond the solder ball 20 to the metallization layers of the pad 11. This reflow process can be quite intricate, and a detailed discussion is beyond the scope of this disclosure. The upshot, however, is that when the solder 20 melts, the Au layer 18 in contact with the melted solder 20 goes quite rapidly into solution into the solder 20, thus exposing the Ni layer 16 to the solder 20. The solder 20 reacts with the Ni 16, and forms an intermetallic compound (IMC) region 19 that mechanically binds the solder 20 with the Ni layer 16. The IMC 19 is typically composed of Ni and Sn (NiSn); Ni, Sn and Cu (NiCuSn); or Ni, Cu, Au, and Sn and can be quite thin, from about 0.1 µm to about 5 µm, depending upon the amount of Cu in the SAC, the thermal profile used for reflow, and the number of reflow cycles the device 1 is exposed to.

The IMC 19 may be thought of as the "glue" that holds the solder ball 20 to the substrate 10. Defects in this glue can lead to dropped solder balls, as shown in FIG. 1 with pads 11a. Pads 11a without solder balls 20 cannot be electrically connected to a circuit board and thus are electrical failure points of the device 1. Stress imparted to the solder balls 20 during testing, shipping, assembly, accidental dropping or the like may cause the solder balls 20 to separate from their respective pads 11, and thus lead to electrical failure. Such separation (or ball drop) results from brittle fracture in and around the solder 20 to pad 11 metallization interface; that is, within the IMC region 19.

To address this issue, the prior art has sought to adjust the Pb-free alloy composition. The most widely used composition of SAC is an alloy containing 3 to 4 weight percent (wt. %) of Ag, 0.5 to 1 wt. % of Cu, and 95 to 96.5 wt. % of Sn. Reduction in the Ag content reduces the yield strength of the alloy. Since the maximum stress that the solder joint experiences during mechanical loading is essentially determined by the yield strength of the alloy, a lower Ag content implies less stress on the joint when the solder 20 is exposed to high strain rate mechanical loading. Thus, lowering the Ag content is expected to provide a solder joint that is less prone to brittle failure in the IMC 19 when exposed to high strain rate stresses. Although some researchers have found low Ag content solders are less prone to brittle failure during drop testing, other data is not as clear. This may imply that there are other mechanisms playing a role in the brittle nature of the joint.

Accordingly, there is an immediate need for improved soldering methods, and related electrical devices, that are less prone to brittle failure in solder joints.

SUMMARY OF THE INVENTION

In one aspect, an electronic device is disclosed that has an improved solder joint that is less prone to brittle failure. In one embodiment, an electronic device comprises a non-conductive core layer, one or more conductive copper (Cu) layers, one or more polymer insulating layers, a polymer layer over the outer-most Cu layer with openings to expose Cu regions referred to as pads, a nickel (Ni) layer disposed over at least a portion of the exposed Cu pads, a gold (Au) layer deposited on top of the Ni layer, and an intermetallic compound (IMC) region that couples the solder mass to the Ni layer. The Ni and Au layers contain no more than 5000 ppm by weight of phosphorus (P), preferably less than 500 ppm by weight of P, more preferably less than 50 ppm by weight of P, even more preferably less than 10 ppm by weight of P, and more preferably still less than 1 ppm by weight of P.

In other preferred embodiments, the solder mass comprises at least 90% tin by weight, and the IMC region comprises an alloy of nickel and tin, nickel, copper, and tin, or Ni, Cu, Au, and Sn.

In another aspect, a soldering method is disclosed. A component and a solder mass are contacted together, and then the solder mass is heated to form an IMC region that couples the solder mass to a Ni layer on the component. The Ni layer contains no more than 5000 ppm by weight of phosphorus (P), preferably less than 500 ppm by weight of P, more preferably less than 50 ppm by weight of P, even more preferably less than 10 ppm by weight of P, and more preferably still less than 1 ppm by weight of P. In certain preferred embodiments, the component further comprises a Au layer disposed over at least a portion of the Ni layer. The Au layer has not more than 5000 ppm by weight of phosphorus (P), preferably less than 500 ppm by weight of P, more preferably less than 50 ppm by weight of P, even more preferably less than 10 ppm by weight of P, and more preferably still less than 1 ppm by weight of P.

In other preferred embodiments, the solder mass comprises at least 90% tin by weight, and the IMC region comprises an alloy of nickel and tin, or nickel, tin, and copper. In a specific embodiment, the solder is heated to at least 230° C. to form the IMC.

BRIEF DESCRIPTION OF THE DRAWINGS

FIG. 1 is a perspective view of an electronic device with a ball grid array (BGA).

FIG. 2 is a side view of a portion of the BGA shown in FIG. 1 prior to reflow heating.

FIG. 3 is a side view of a portion of the BGA depicted in FIG. 1.

FIG. 7B is a detailed view of a portion of the image shown in FIG. 7A.

FIG. 7C is yet another detailed view of a portion of the image shown in FIG. 7A.

DETAILED DESCRIPTION

Figure 4A:
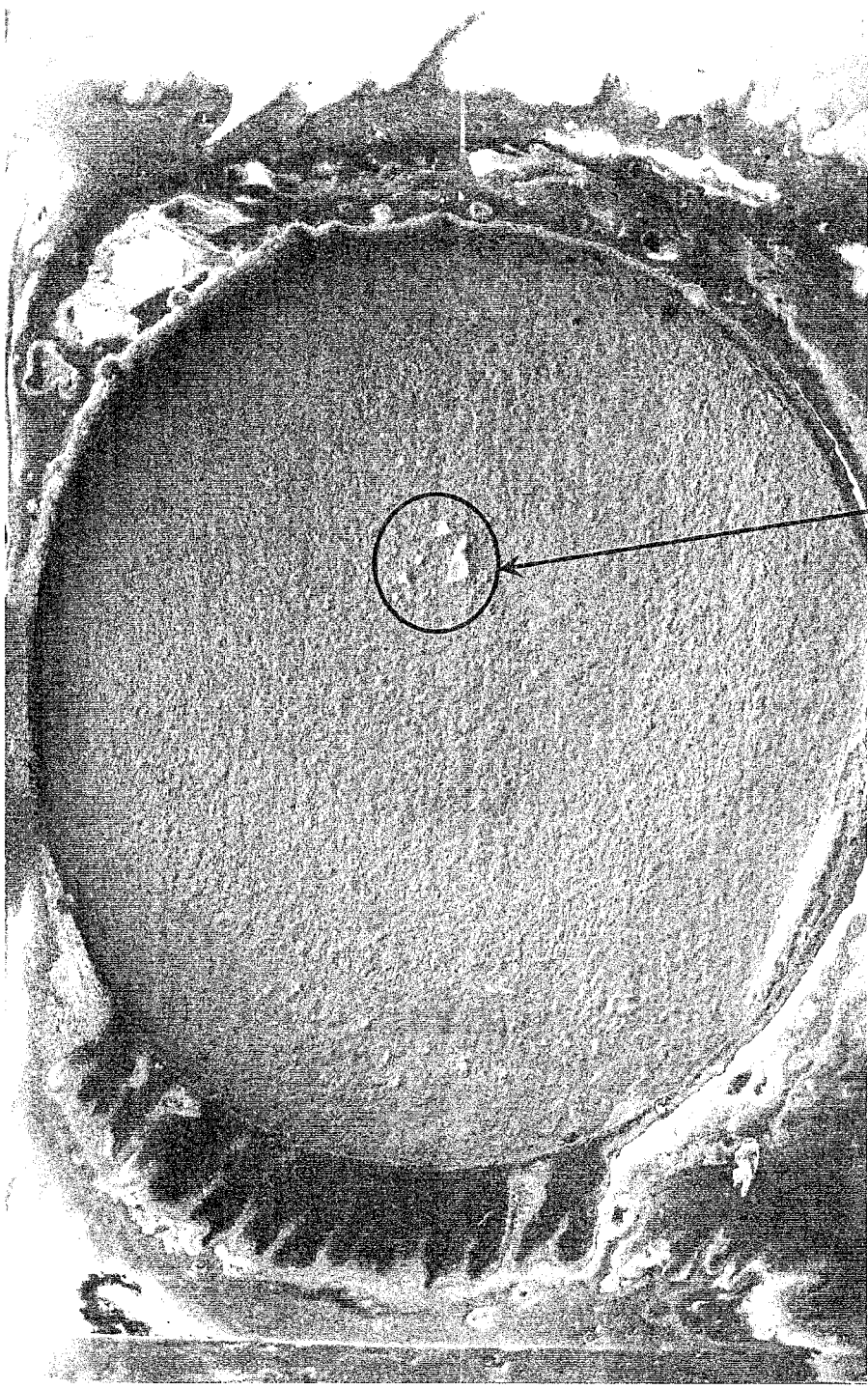
FIGS. 4A & 4B are SEM micrographs of BGA pads.

Soldering methods, and related devices employing solder joints formed according to the soldering methods, are generally described herein. For purposes of the following, an intermetallic compound (IMC) region need not contain only metals, but may also contain other elements in the form of inclusions within the solder itself and within the metal layers with which the solder reacts or contacts. An IMC may be thought of as the reactive region or contact region between the solder and the metal to which the solder binds. Additionally, when a first layer is said to be disposed "over" a second layer or device, it should be understood that the first layer may be disposed on the second layer or device, or may be disposed upon a third layer or layers that are in turned disposed on the second layer or device. The third layer or layers may not be explicitly indicated in the interests of brevity.

It has been discovered that high strain rate brittle failure occurs in a solder joint within the substrate pad metallization/solder reaction zone, i.e. within the IMC. The fracture region comprises a thin layer containing nickel and phosphorus (NiP) within the IMC layer that forms between the solder and the Ni substrate metallization. Unexpectedly, the fracture region appears to develop only when the phosphorus (P) content in Au and Ni layers of typical thicknesses is less than 5000 parts per million (ppm) by weight. Metallization regions that have P contents in excess of 1% by weight, such as electroless nickel used in combination with immersion gold, referred to as ENIG, which typically contains 2-12% by weight of P, do not typically experience this type of high strain rate brittle failure. In particular, solder joints have been found to be particularly susceptible to brittle failure when the P content in the Ni and/or Au layer is between 50 and 5000 ppm by weight. Without wishing to be bound by theory, it is believed that eliminating, or substantially eliminating, the P-containing layer that forms within the IMC region will significantly improve the fracture toughness of the solder joint, thus reducing the propensity for brittle failure during high strain rate mechanical loading.

It is not commonly known that some electroplated Ni and Au metallization layers may contain P. However, the electroplating bath chemistries used to form the Ni and Au metallization bi-layer sometimes contains P in various forms. The P is, among other things, often added to improve the plating process, e.g. uniformity, throughput, efficiency, etc. If P is present in the plating bath, some fraction of it can be unintentionally incorporated into the Ni/Au bi-layer during the electroplating process itself. Other electroplating baths exist, however, that do not contain P, but since the embrittlement problems with Pb-free soldering to Ni/Au films containing low levels of P are not known prior to the instant disclosure, the industry has not been driven to use such baths. For example, one such P-free Ni plating bath is the NiKal PC-3 bath by the Rohm and Hass corporation. It is believed that by using electroplating baths that contain relatively little or no P, a substantially phosphorus-free (P-free) Ni/Au bi-layer can be formed on the substrate which will, in turn, ensure a substantially P-free IMC region in the solder joint. This in turn will improve resistance to brittle failure of the solder joints.

Figure 4B:
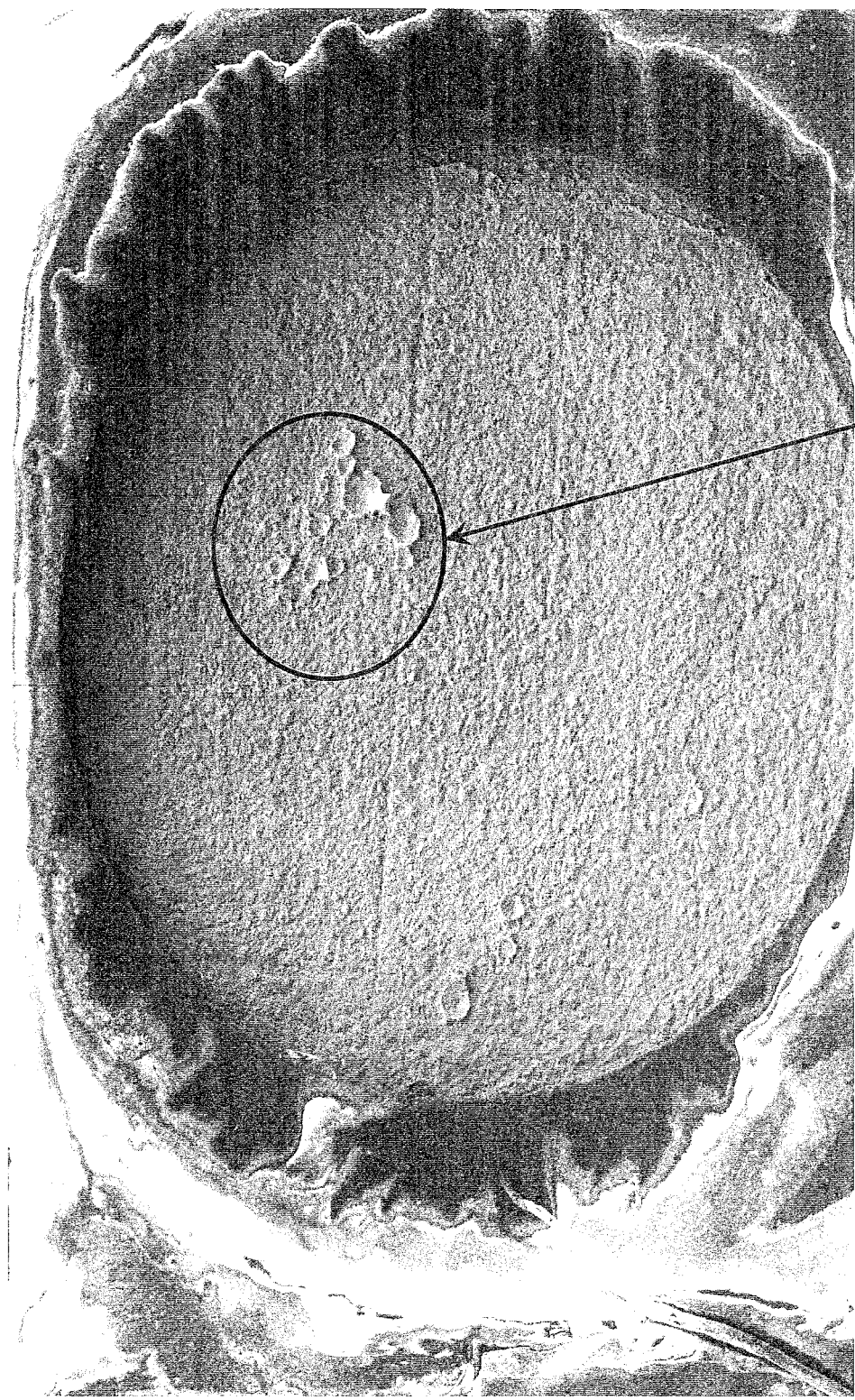
Figure 5:
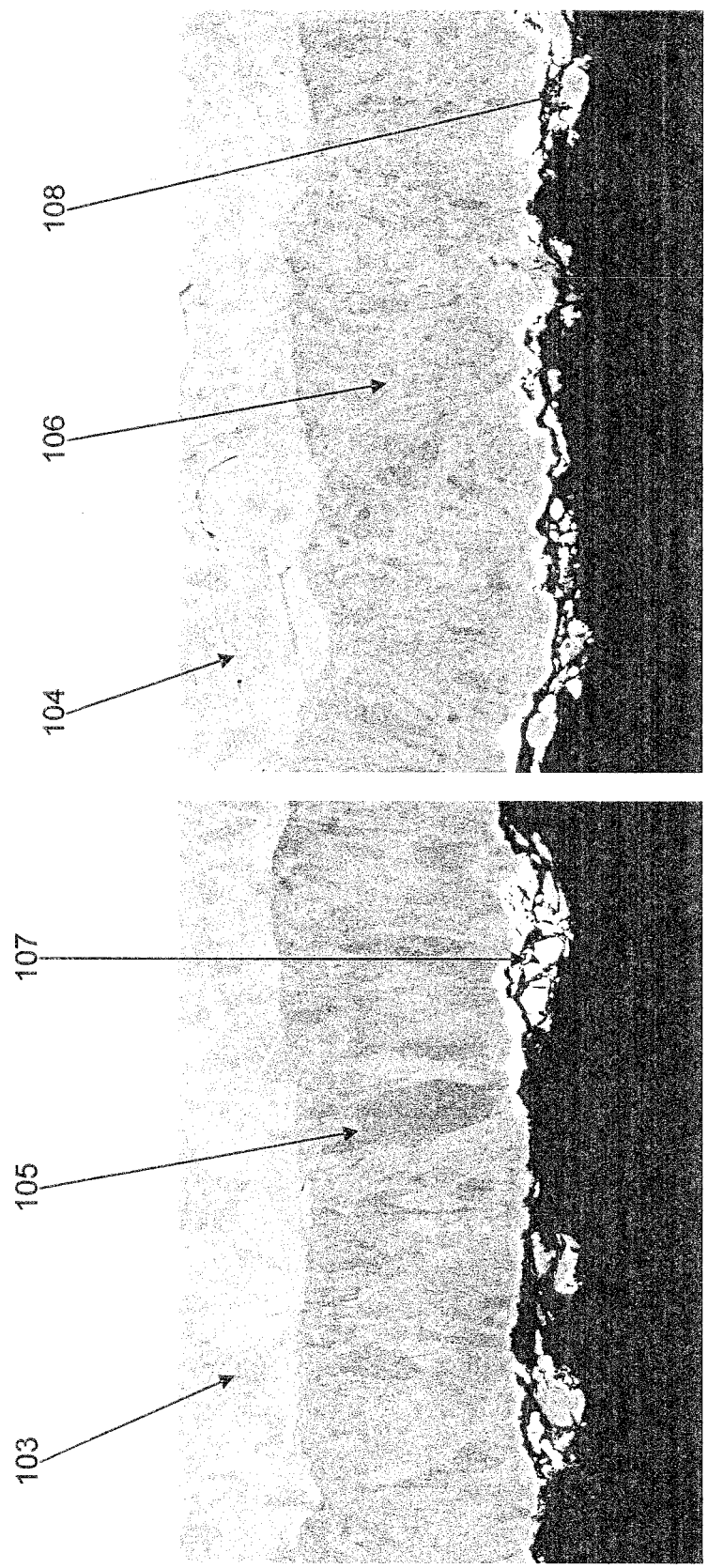
FIG. 5 shows cross-sectional SEM micrographs of the pads depicted in FIGS. 4A & 4B.
Figure 6:
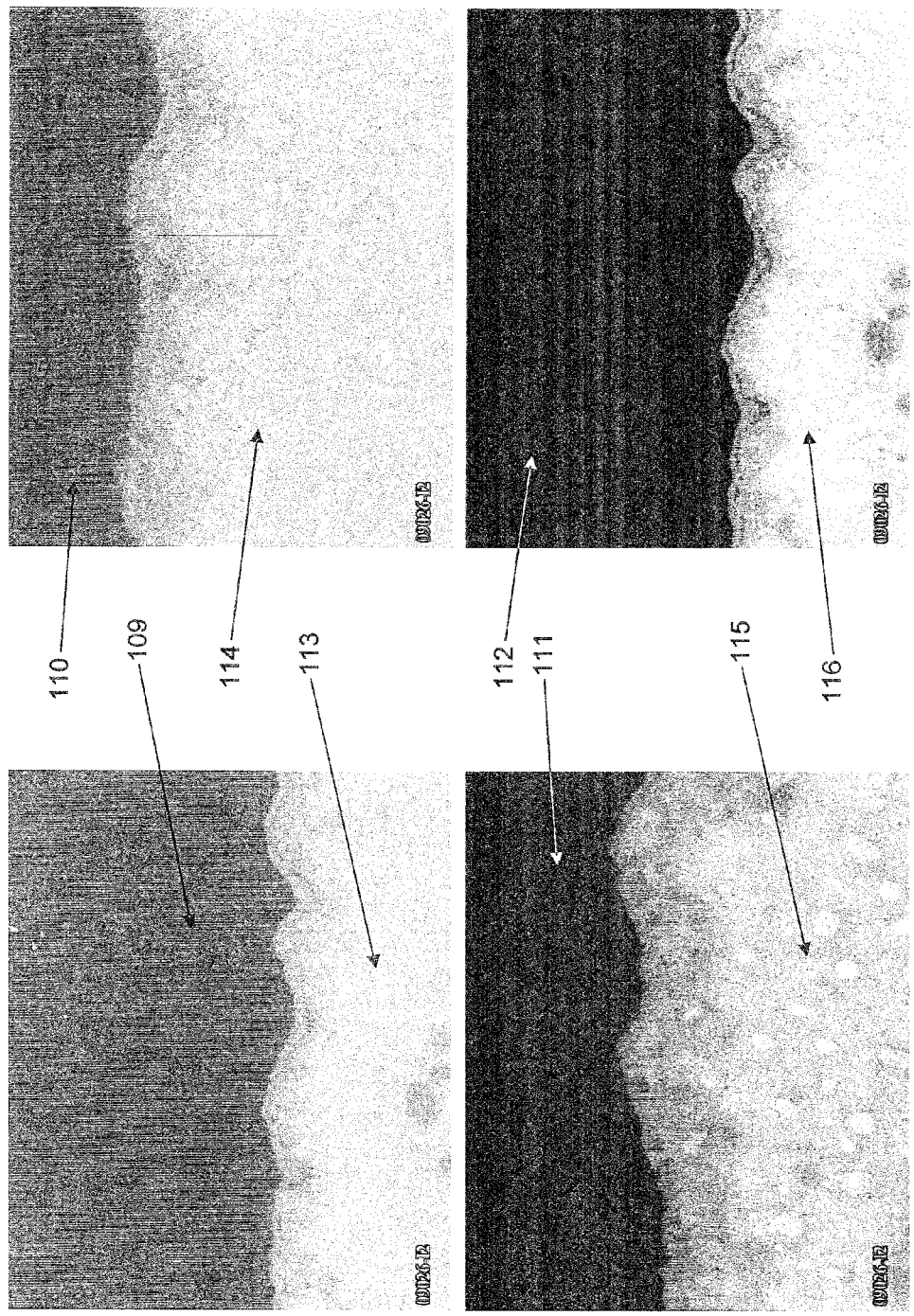
FIG. 6 shows cross-sectional SEM micrographs of four pads immediately adjacent to the two pads depicted in FIGS. 4A & 4B.
Figure 7A:
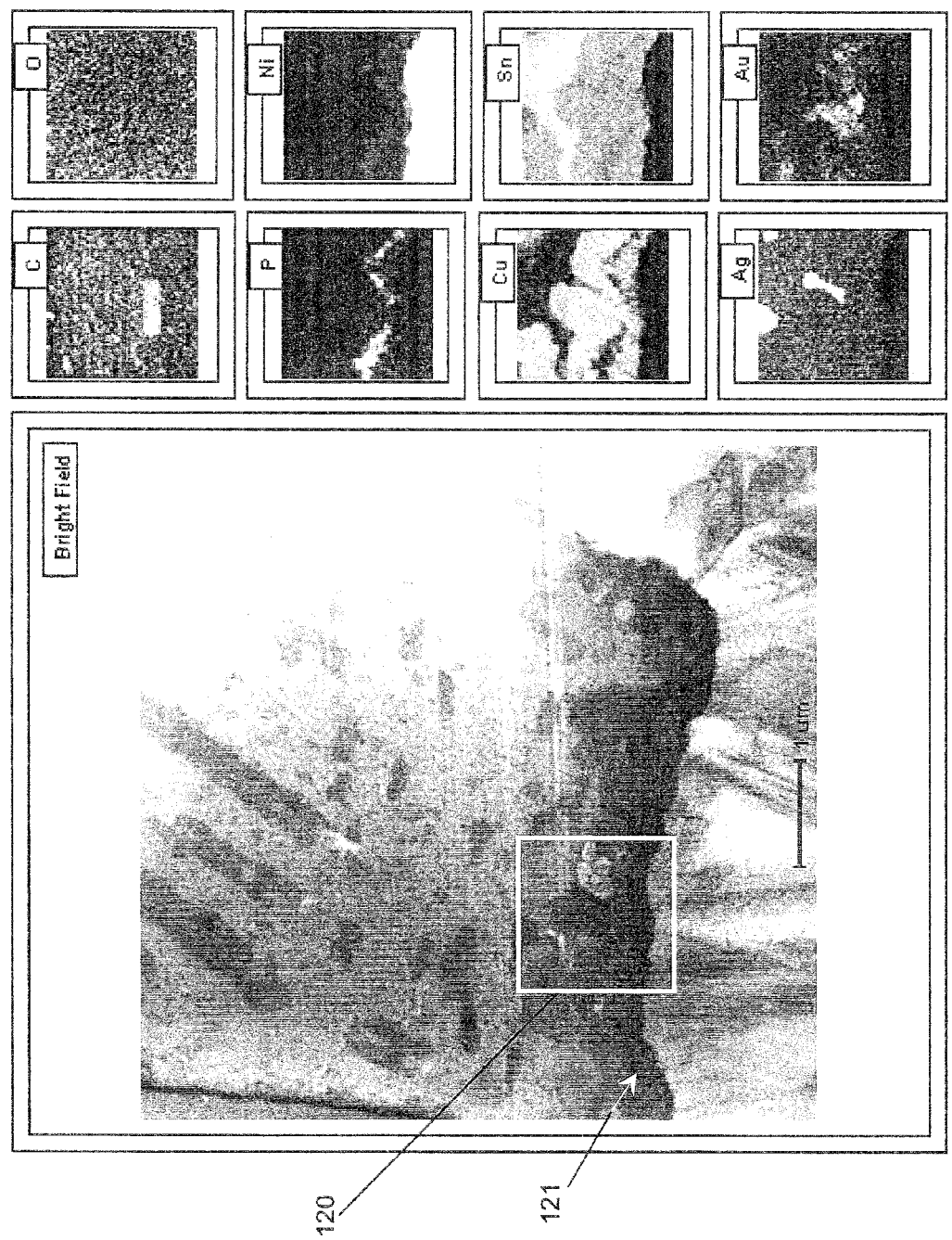
FIG. 7A shows a cross-sectional Transmission Electron Micrograph (TEM) of a region of a solder joint whose SEM cross-section is shown in FIG. 6.

FIGS. 4A and 4B show planar scanning electron microscope (SEM) micrographs of two different substrate BGA pads that exhibited typical brittle failure of the solder joint after exposure of an electronic device to stresses applied at high strain rates. In both cases the failure occurs within the IMC reaction zone. Solder 101, 102 is visible in FIGS. 4A and 4B. FIG. 5 shows cross-sectional SEM micrographs of these two pads. Visible in the micrographs is Cu 103, 104; Ni 105, 106; and a Ni/Sn IMC 107, 108. FIG. 6 shows cross-sectional SEM micrographs of four pads 109-112 with respective solder 113-116, still remaining on the pads 109-112, in which the four pads 109-112 are immediately adjacent to the two pads with missing (dropped) solder balls. As shown, in each case there is a distinct dark layer within the IMC layer that is located in the vicinity of the surface that was exposed on the pads with missing solder balls (brittle fracture surface shown in FIG. 5). Other ball drop failures were examined in a similar manner. In each case similar micro-structural information was obtained. This evidence indicates that the brittle failures occur within this dark region of the IMC. FIG. 7A shows a cross-sectional Transmission Electron Micrograph (TEM) of a region of a solder joint whose SEM cross-section is shown in FIG. 6 within the box 120. Also shown are the elemental chemical composition maps taken with Energy Dispersive Spectroscopy (EDS) of the TEM cross-section. The IMC region 121 is composed of (NiCu)Sn. As shown in FIGS. 7B and 7C, isolated AgSn 122 and AuSn 123 and precipitates are observed within the (NiCu)Sn IMC. A specific layer 124 within the IMC layer is composed of Ni, P, and possibly Sn; however, P is not observed in any other region of the IMC. Given that Ni and Sn are present throughout the IMC layer, this demonstrates that P plays a critical role in brittle failure. It has further been observed that the failure region readily forms in solder joints that are formed by heating the solder to a temperature that is 230° C. or more. When lower temperatures are used, such as those used for PbSn solder, which may be less than 225° C., no such P-containing layers are found. This increased temperature may be one of the reasons why the same failure mechanisms are not observed in PbSn solder joints. It is believed that elimination of P will eliminate this failure mode for solder joints formed above 230° C., although it is also believed that elimination of P will also help reduce brittle failure in other types of solder joints as well.

Figure 8:
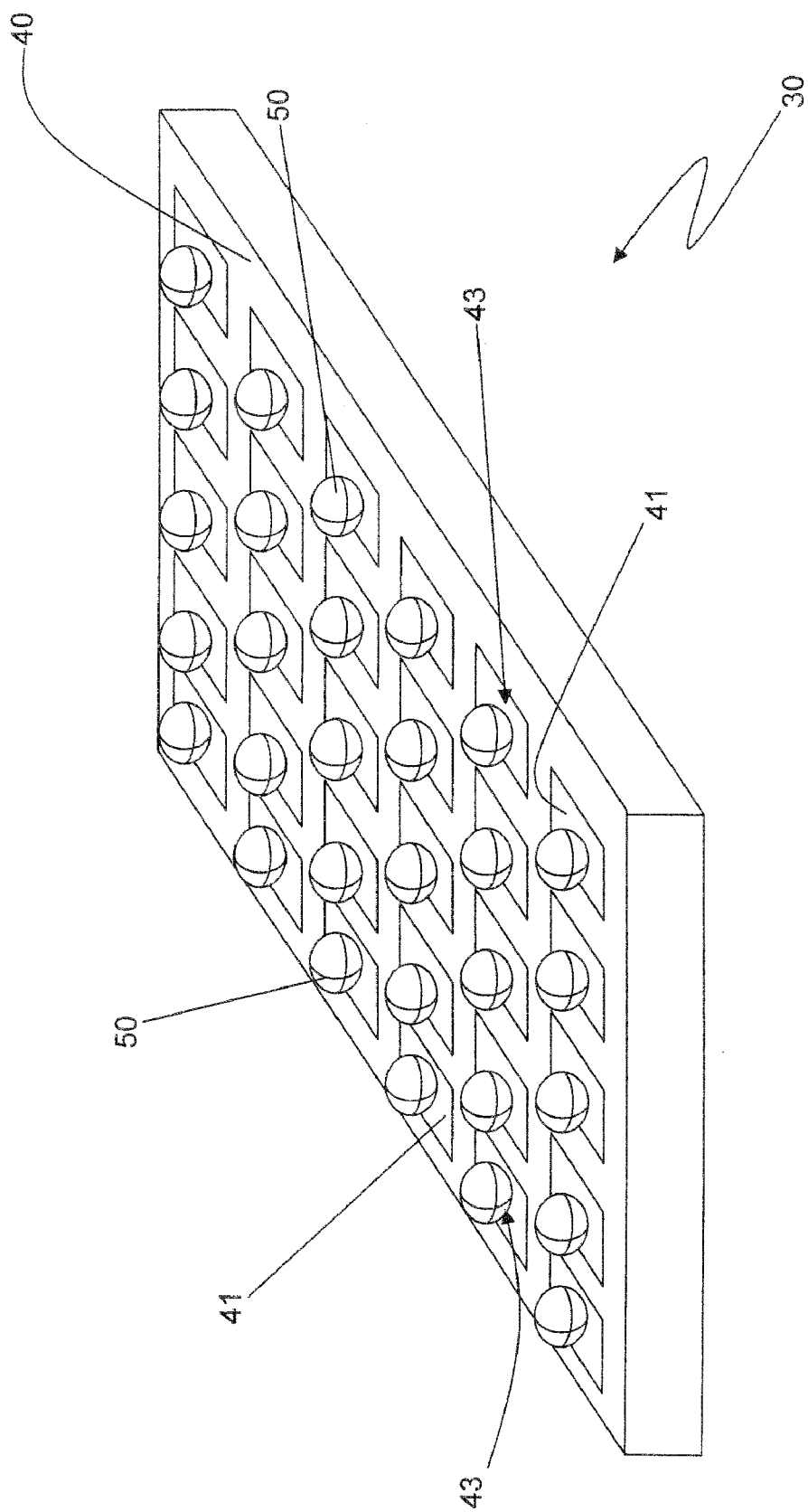
FIG. 8 is a perspective view of an embodiment electronic device.
Figure 9:
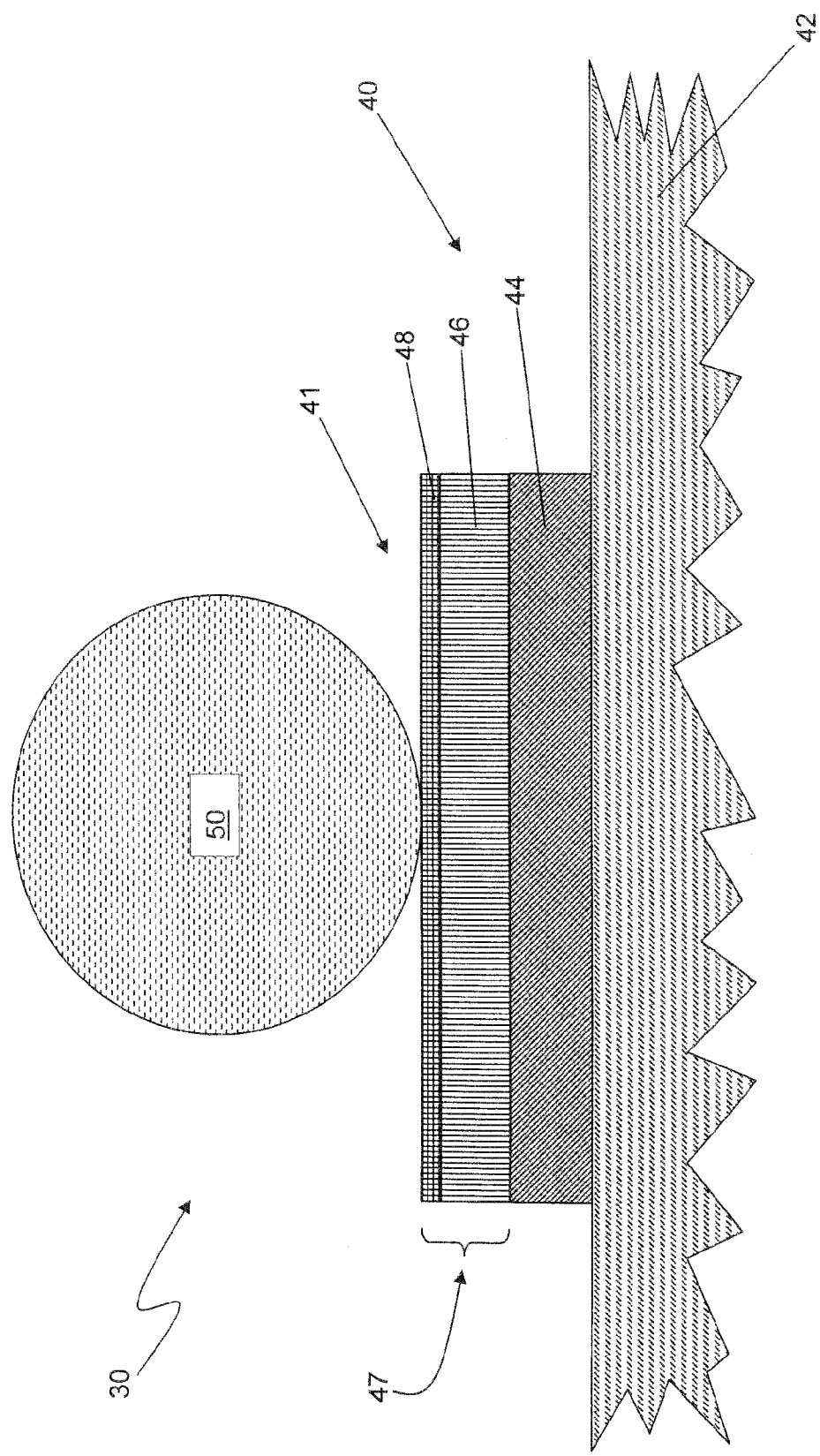
FIG. 9 is a side view of a portion of the electronic device shown in FIG. 4 prior to reflow heating.

FIG. 8 is a perspective view of an electronic device 30 employing solder joints 43 formed according to an embodiment soldering method. The electronic device 30 comprises at least one solder mass 50, which may, for example, be a pre-formed solder ball, attached to a metallization layer 41, such as by reflow soldering. The solder joint 43 comprises the IMC region that bonds the bulk of the solder mass 50 to the metallization layer 41. For example, as shown in FIG. 9, the device 30 may be a BGA component, with solder balls 50 bonded to pads 41 in the BGA. However, any electronic device which employs solder may employ the embodiment methods to form brittle-fracture resistant solder joints 43. The solder joints 43 are substantially, and ideally completely, free of a P-containing layer embedded within IMC region. This is achieved in certain specific embodiments by limiting the P content in the Ni and Au layers to less than 50 ppm by weight, more optimally less than 10 ppm by weight, and even more optimally to less than 1 ppm by weight.

More generally, the P concentration in the Ni and Au layers may be considered in the context of the amount needed to form the thin Ni—P layer that is believed to cause brittle failure. Thus, metallization structures with relatively thicker Ni and Au layers may have a lower P concentration threshold than relatively thinner Ni and Au layers in order to limit the total P content per unit volume in the system. In the case of Ni, the amount of Ni that reacts with the solder may be kinetically limited to approximately 0.1 to 0.2 µm depending upon the temperature at which the solder/metal reaction takes place. Furthermore, the thickness of Ni typically is well in excess of 1 to 2 µm. Therefore, the absolute Ni thickness may have a relatively small influence on the overall amount of P contributed to the IMC. Rather, it is the reacted Ni thickness that will primarily determine the threshold P concentration in the bulk Ni layer for which embrittlement will initiate. This P concentration may be approximately 2000 to 5000 ppm depending on the temperature at which the solder/Ni is reacted. The addition of other elements to the IMC such as Au and or Cu may lead to thicker Ni-containing IMC layers which may influence the overall P content requirement in Ni to initiate embrittlement. This level may be as low as 1 ppm of P depending on the thickness of the Ni reacted. In the case of Au, the thickness can vary significantly, but typically it is between 0.1 and 0.8 µm. Larger variations may be possible for specific designs. The variation in Au thickness is typically not too large across a single substrate. However, between substrates the variation in thickness can span most of the 0.1 to 0.8 µm specification. Furthermore, thicknesses of Au in excess of 3 µm can easily dissolve in the solder during a standard soldering process. This may be, in fact, where the range in P content comes into play for the Au layer. If the thickness of Au on the Ni layer could be controlled at 0.1 µm, then the maximum range in P may be approximately 5000 ppm. Likewise for a 0.8 µm thick layer, it may be approximately 625 ppm. For layers that are thicker than 0.8 µm it may be significantly less than 100 ppm and could be as low as 1 ppm. Finally, the concentration of P that is acceptable in the Au and Ni layers may be somewhat dependent upon the solder volume used in the joint. For example, for the above calculations the solder volume was approximately 0.00131 $cm^3$ (a 630 µm diameter solder ball). For a smaller solder ball, for example one with a diameter of 300 µm, the concentration of P that would be acceptable for a given Au and Ni-reaction thickness may be reduced by approximately the ratio of the volume of the solder balls cubed, e.g. (630 μm/2/300 μm/2)³~9.3 relative to the 630 μm solder ball diameter case.

Reducing brittle failure in a solder joint may thus comprise, in various embodiments, controlling the amount of P in the Ni layer, and the amount of P in the optional Au layer, so as to prevent the formation of an effective NiP layer in the IMC that would otherwise lead to brittle failure. Controlling the amount of P may be a function of the expected size of the solder balls. An effective NiP layer is one which leads to brittle failure, for example by being sufficiently thick or extensive as to cause brittle failure. In specific embodiments, prevention of the formation of an effective NiP layer in the IMC may mean that the effective thickness of a NiP layer within the IMC, which may comprise continuous regions, discrete regions or both of NiP-containing material, is no greater than 1500 angstroms (Å), more preferably no greater than 150 Å, more preferably still no greater than 10 Å. The effective thickness of the NiP layer may be computed, for example, by summing the volumes of all discrete and continuous regions or layers of NiP-containing material within the IMC and then dividing this total volume by the area of the solder joint covered by the IMC. An NiP containing material may be considered a discrete phase of material that comprises, at least in part, Ni and P, where the Ni and P components of the phase are at the level of a major (10-100%) or a minor (1-10%) constituent.

As shown in FIG. 9, an embodiment method begins with a substrate 40 that comprises a metallization layer 41 disposed over a core layer 42. The metallization layer 41 typically comprises a Cu layer 44, which may be coated with a polymer film that has holes in specified regions to expose the Cu layer 44. The exposed regions of the Cu layer 44 may then be coated with a bi-layer metal film 47. In particular, the bi-layer metallization 47 may include a Ni layer 46. The Ni layer 46 covers the BGA pads 41 that electrically connect the solder mass 50 to another circuit component, such as a semiconductor die within the device 30. The core layer 42 may be, for example, a non-conductive organic material, such as BT. Completing the bi-layer metallization 47 on the BGA pads 41 is a Au layer 48, which covers the Ni layer 46. The Au layer 48 is not required, but is desirable, for example, to prevent oxidation of the nickel layer 46. Although highly desirable, the Cu layer 44 may not necessarily be required. That is, the bi-layer 47 may be disposed directly onto the core layer 42, or the Ni layer 46 may alone be disposed on the core layer 42. As described above, when forming the bi-layer metallization 47, the amount of P within the layers 46, 48 is controlled to prevent the formation of any effective NiP layer within the IMC region during a subsequent soldering process. That is, the amount of P is controlled to prevent the formation of a NiP layer or regions that could otherwise lead to brittle failure.

Figure 10:
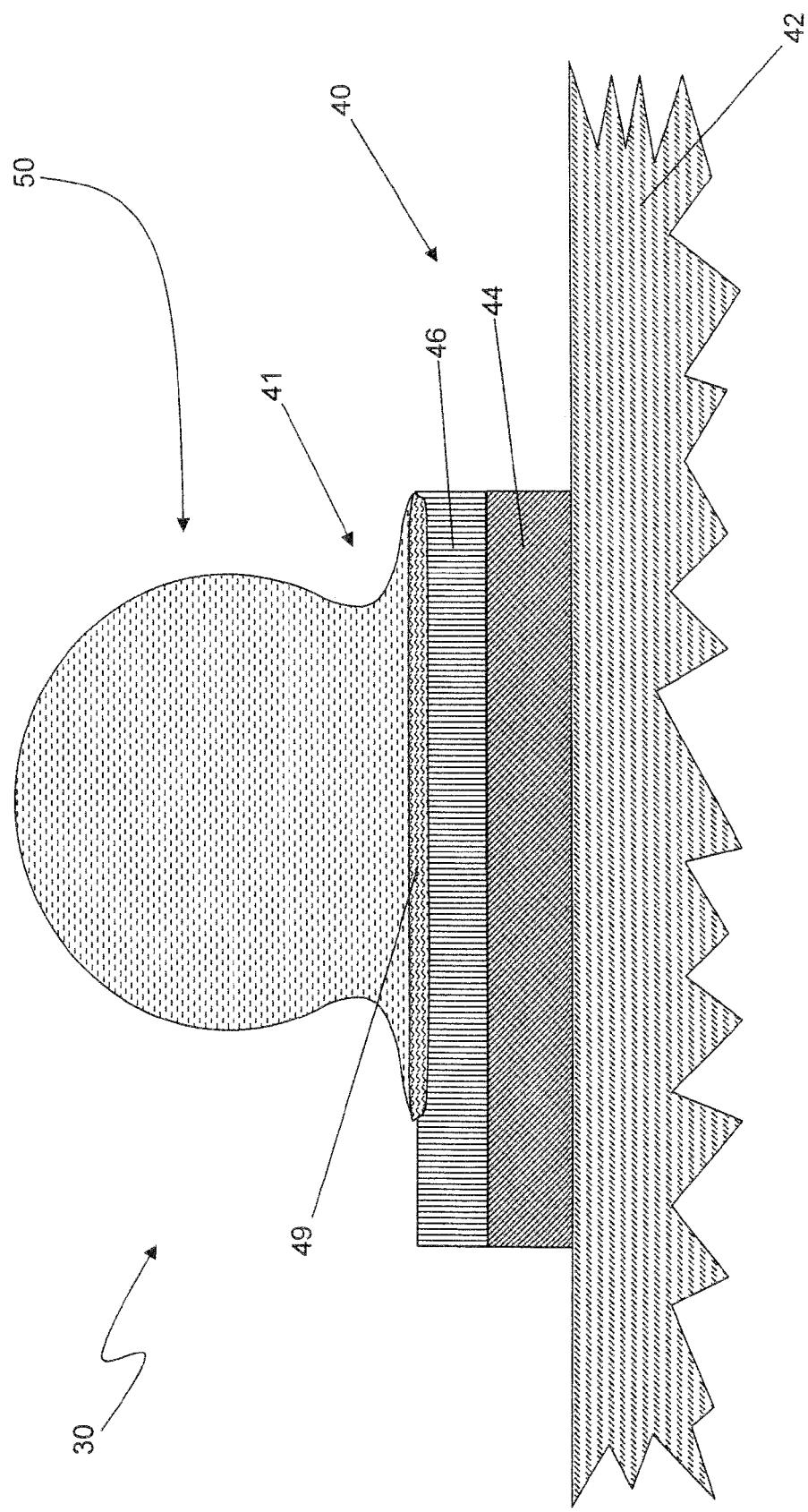
FIG. 10 is a side view of a portion of the electronic device shown in FIG. 4 after reflow heating.

Although not shown in FIG. 9, any suitable flux may optionally be used to cover the Au layer 48, the solder mass 50 or both. Then, the solder mass 50 is brought into contact with the substrate 40, and in particular with the flux and bi-layer metallization layer 41. The solder mass 50, which is preferably SAC, SACX, or other commonly used Pb-free solder alloys, is heated to at least the melting point of the solder mass 50 (i.e., of the SAC alloy) and then cooled to form an IMC region 49 that provides the basis of the solder joint 43, as shown in FIG. 10. Any known heating device and method may be employed to heat the solder mass 50, the metallization layer 41 or both so as to form the IMC region 49. In certain specific embodiments, the solder mass 50 is heated to a temperature of at least 235° C., although lower temperatures, such as around 230° C., may be possible. The IMC region 49 couples the solder mass 50 to the nickel layer 46. In particular, when SAC is used for the solder mass 50, the IMC region 49 comprises NiSn, NiCuSn, or both. In certain preferred embodiments, the IMC region 49 contains less than 500 ppm of P, preferably less than 100 ppm of P, even more preferably less than 50 ppm of P, even more preferably still less than 10 ppm of P and ideally less than 1 ppm of P or substantially no P. In other embodiments, the IMC region 49 has no NiP region or layer with an effective thickness that exceeds 1500 Å. In certain preferred embodiments, the IMC region 49 has no NiP region or layer with an effective thickness that exceeds 10 Å.

The IMC region 49 is formed when melted solder 50 contacts and reacts with the Ni layer 46. Without wishing to be bound by theory, it is believed that when Au from the Au layer 48 goes into solution into the melted solder 50, any P present in the melted Au forms a front that tends to concentrate in the IMC region 49. Additionally, P that may be present in the Ni layer 46 may also form in the IMC region 49. The Au layer 48 and Ni layer 46 are thus formed so that, in certain embodiments, their respective P concentrations are sufficiently low such that P-containing layers in excess of 0.150 μm thick, and more preferably 0.035 μm thick, do not form within the IMC region 49. Moreover, in these embodiments there are ideally no P-containing regions thicker than 0.150 μm, and more preferably 0.035 μm, in the IMC layer 49 that cover more than 25% of the surface area of the IMC region 49. For example, both the Au layer 48 and the Ni layer 46 may have no more than 50 ppm by weight of P. Even more preferably, both the Ni layer 46 and the Au layer 48 have less than 10 ppm by weight of P, and more preferably still, less than 1 ppm by weight of P. However, as indicated above, these values may change depending upon the respective thicknesses of the Ni layer 46 and the Au layer 48. Ideally, the Au layer 48 and the Ni layer 46 contain substantially no P. In the above, it should be noted that a P-containing layer may be thought of as a thin film that spans across substantially all of the IMC 49; that is, a layer that spans all, or nearly all, of the cross-sectional surface area of the IMC along the plane of the metallization layer 41. A P-containing region may be thought of as a sub-region within the IMC 49 or as a partial layer within the IMC 49. An effective NiP layer, on the other hand, may be thought of as a mathematical construct based upon the volumes of all NiP-containing regions or layers and the area of the solder joint covered by the IMC, and which has an effective thickness sufficient to lead to brittle failure.

Referring back to FIG. 9, known lithographic techniques may be employed to form the metallization layer 41 on the core layer 42. The substrate 40 includes a non-conductive core layer 42, which is typically bismaleimide triazine (BT). Using known methods, Cu traces 44 may be disposed on both sides of the core layer 42 in complex three dimensional patterns with an array of via through holes such that the Cu traces 44 provide an electrical connection from the die interconnect to the bottom side of the BGA substrate 40. Atop the copper traces 44, as previously explained, may be disposed a polymer film, which is typically referred to as a solder mask. The polymer film may have one or more openings that expose the Cu trace 44. The exposed Cu layer 44 may be subsequently coated with a bi-layer Ni/Au film 47 via, for example, electrolytic plating. The baths used to perform the electrolytic plating should contain little or no P so that the respective concentrations of P in the Au layer 48 and Ni layer 46 are low enough to prevent the subsequent formation of P-containing regions or layers in the IMC 49. As previously indicated, an exemplary bath that may be used is NiKal PC-3. Other suitable baths, however, may be employed. Moreover, any other plating method may be used to form the bi-layer 47, so long as the bi-layer 47 has the requisite low-level concentrations of P. The Au layer 48 provides a wettable surface for solder ball 50 attachment. The Ni layer 46 is both metallurgically compatible with the solder 50 and prevents migration of Cu from the Cu layer 44 into the solder 20, and also prevents diffusion of Au in the Au layer 48 into the Cu layer 44. The Au layer 48 protects the Ni layer 46 from oxidation. Typical metallic layer thicknesses are 10-70 μm for the Cu layer 44, 2-10 μm for the Ni layer 46, and 0.05-2 μm for the Au layer 48.

It should be appreciated that surface finishes other than Au may be used for the bimetallic layer 47. For example, a Sn and/or Ag layer may be used to replace the Au layer 48, so that the bi-metallic layer 47 is formed from a bottom layer 46 of Ni and a top layer 48 of Sn. Similarly, other barrier layers such as Pd or Pt in place of Ni or in addition to Ni could be placed between the Au and the Cu or the Ni and the Au. As with the above embodiments, both of these layers 46, 48 should have little or no P so as to prevent the formation of P-containing layers or regions in the IMC 49. Hence, in general, it is anticipated that whatever metals are used for the pad 41, the metallic reaction zone that ends up forming the IMC region 49 should contain little or no P as discussed above so as to prevent the formation of any P-containing layers or regions in the IMC 49 that may otherwise lead to brittle failure.

Figure 11:
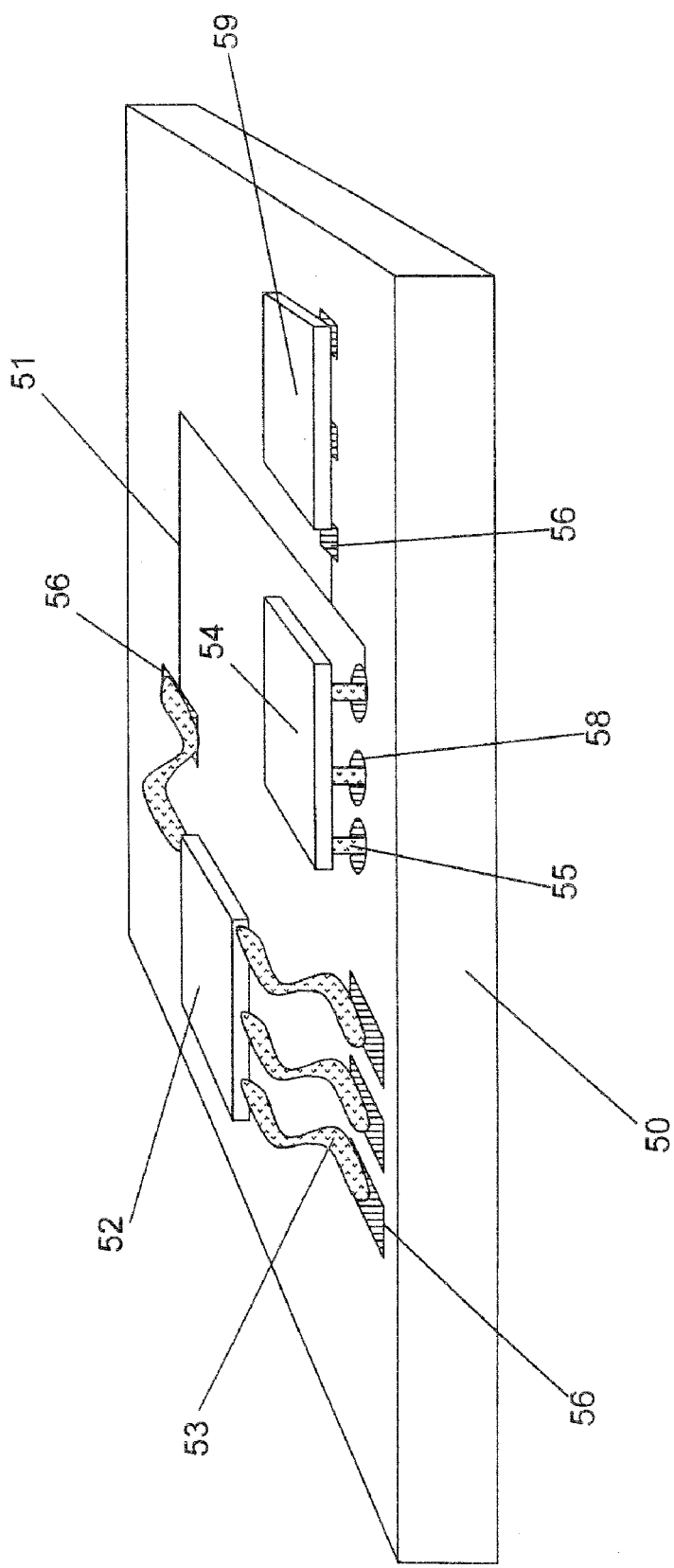
FIGS. 11 and 12 provide examples of utilizing an embodiment soldering method to electrically connect various devices to each other.
Figure 12:
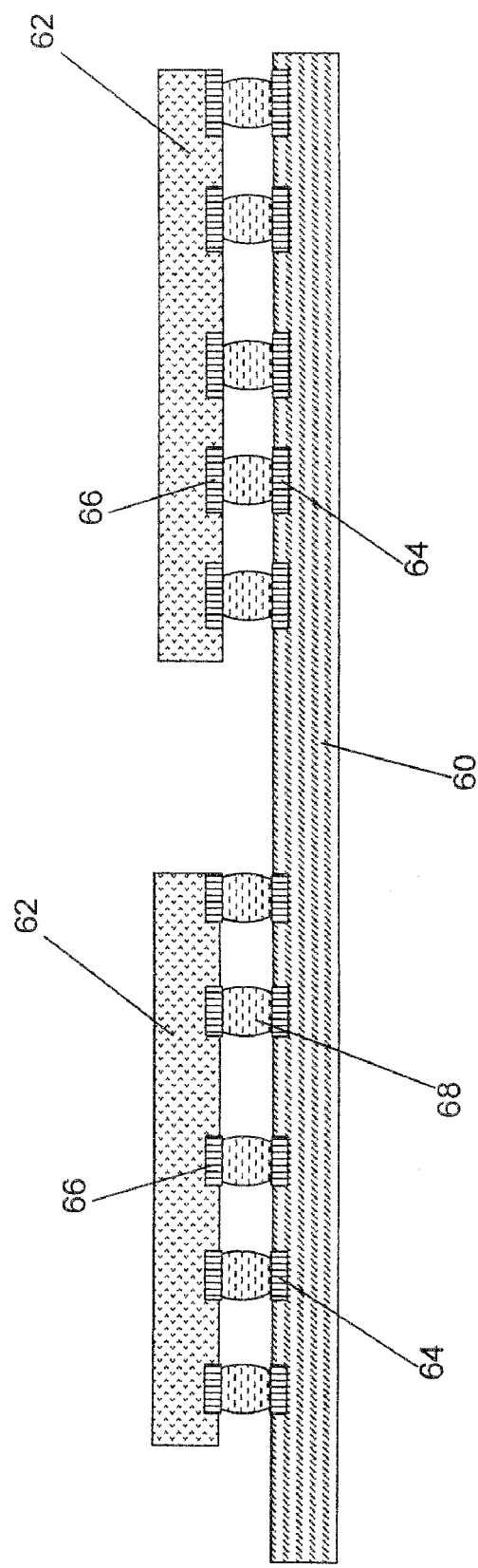

FIGS. 11 and 12 provide examples of utilizing an embodiment soldering method to electrically connect various devices to each other. In FIG. 11, integrated circuits 52, 54 are electrically connected to a circuit board 50. The circuit board 50 has pads 56 formed in accordance with the an embodiment plating chemistry, and plated through holes 58 that are also formed in accordance with an embodiment plating chemistry. Integrated circuit 52 has leads 53 soldered to the pads 56, employing surface mount technology, while integrated circuit 54 has leads 55 soldered into the through holes 58, employing through hole mount technology. A discrete component 59 may, for example, be soldered to pads 56, employing surface mount technology, or to plated through holes 58 using through hole mount technology. The discrete component 59 may include, but is not limited to, a resistor, a capacitor, a transistor, an inductor, a crystal, etc. The circuit board 50 may also include conductive traces 51, which may be used to electrically connect various device together.

In FIG. 12, a flip chip or BGA device 62 is mounted to the substrate of a circuit board 60, employing an embodiment soldering method. The substrate has pads 64 formed in accordance with an embodiment plating chemistry, and the flip ship or BGA device 62 has corresponding pads 66 formed according to an embodiment plating chemistry. Disposed between the pads 64, 66 are solder balls 68, which are soldered to the pads 64, 66 in accordance with an embodiment soldering method, and which electrically connect a device pad 66 to another corresponding substrate pad 64.

As indicated above, the embodiment soldering techniques may be used to solder a BGA to a circuit board, to solder a flip-chip to a circuit board, and to solder discrete components to a circuit board, such as, but not limited to, resistors, capacitors, inductors, crystals, etc. It will also be appreciated, however, that the instant soldering methods and related plating chemistries may also be employed, for example, to solder a flip-chip to another flip-chip. Indeed, it is believed that most, if not all, applications that require the soldering of a component to another component may be successfully employed with the instant soldering method.

Although the invention herein has been described with reference to particular embodiments, it is to be understood that these embodiments are merely illustrative of the principles and applications of the present invention. For example, although the discussion has been made with specific reference to BGA devices, it should be understood that any electronic device that employs soldered connections may benefit from the instant disclosure, such as circuit boards in general. Additionally, it will be appreciated that additional layers may be employed in the electronic device other than the ones explicitly disclosed. For example, it may be possible to interpose a P-containing Ni layer, or other layer, between the Cu layer and the substantially P-free Ni layer. It is therefore to be understood that numerous modifications may be made to the illustrative embodiments and that other arrangements may be devised without departing from the spirit and scope of the present invention as defined by the following claims.

The invention claimed is:

1. An electronic device comprising:
a core layer;
a nickel layer disposed over at least a portion of the core layer;
a solder mass disposed over at least a portion of the nickel layer; and
an intermetallic compound region coupling the solder mass to the nickel layer, the intermetallic compound region devoid of an effective nickel-phosphorus layer and having no more than 5000 parts per million of phosphorus by weight;
wherein the nickel layer contains an amount of phosphorous controlled as a function of an expected size of the solder mass.

2. The electronic device of claim 1 wherein the intermetallic compound region is devoid of any phosphorus-containing layers thicker than 0.150 μm, and is free of any phosphorus-containing regions in excess of 25% of the surface area of the intermetallic compound region and thicker than 0.150 μm.

3. The electronic device of claim 1 wherein the intermetallic compound region is devoid of a nickel-phosphorus layer or region having an effective thickness in excess of about 1500 Å.

4. The electronic device of claim 1 wherein the intermetallic compound region is devoid of a nickel-phosphorus layer or region having an effective thickness in excess of 150 Å.

5. The electronic device of claim 1 wherein the intermetallic compound region is devoid of a nickel-phosphorus layer or region having an effective thickness in excess of 10 Å.

6. The electronic device of claim 1 wherein the nickel layer is directly coupled to the intermetallic compound layer and comprises no more than 50 parts per million by weight of phosphorus.

7. The electronic device of claim 1 further comprising a copper layer disposed between the core layer and the nickel layer.

8. The electronic device of claim 7 further comprising a gold layer disposed over at least a portion of the nickel layer, the gold layer comprising no more than 50 parts per million by weight of phosphorus.

9. The electronic device of claim 8 wherein the gold layer comprises no more than 10 parts per million by weight of phosphorus.

10. The electronic device of claim 8 wherein the gold layer is substantially free of phosphorus.

11. An electronic device comprising:
a core layer;
a nickel layer disposed over at least a portion of the core layer;
a solder mass disposed over at least a portion of the nickel layer; and an intermetallic compound region coupling the solder mass to the nickel layer, the intermetallic compound region substantially free of any nickel-phosphorus layer or region that is thicker than 0.150 µm;

wherein the nickel layer contains an amount of phosphorous controlled as a function of an expected size of the solder mass.

12. The electronic device of claim 11 wherein the intermetallic compound region is further substantially free of any nickel-phosphorus layer or region that is thicker than 0.150 µm and in excess of 25% of the surface area of the intermetallic compound region.

* * * * *